(12) United States Patent
Schmidt

(10) Patent No.: US 7,476,931 B2
(45) Date of Patent: Jan. 13, 2009

(54) VERTICAL SEMICONDUCTOR DEVICE

(75) Inventor: Gerhard Schmidt, Wernberg (AT)

(73) Assignee: Infineon Technologies AG, Munich (DE)

( * ) Notice: Subject to any disclaimer, the term of this patent is extended or adjusted under 35 U.S.C. 154(b) by 137 days.

(21) Appl. No.: 11/592,743

(22) Filed: Nov. 3, 2006

(65) Prior Publication Data

US 2007/0138542 A1 Jun. 21, 2007

(30) Foreign Application Priority Data

Nov. 4, 2005 (DE) .................... 10 2005 052 733

(51) Int. Cl.
*H01L 29/76* (2006.01)
(52) U.S. Cl. .................. 257/328; 257/330; 257/492; 257/493; 257/E29.201
(58) Field of Classification Search .................. 257/288, 257/327, 328, 330, 492, 493, E29.201
See application file for complete search history.

(56) References Cited

U.S. PATENT DOCUMENTS

| 4,941,026 | A | 7/1990 | Temple |
| 6,528,355 | B2 | 3/2003 | Hirler et al. |
| 6,720,616 | B2 | 4/2004 | Hirler et al. |
| 6,737,705 | B2 * | 5/2004 | Momota et al. ............. 257/330 |

FOREIGN PATENT DOCUMENTS

DE  19 935 442 C1  12/2000
DE  10 2005 011 967 A1  10/2006

OTHER PUBLICATIONS

Takai, M. et al. Proceedings ISPST 1999, Poster Session 7.1.
Otsuki, M. et al. "1200V FS-IGBT module with enhanced dynamic clamping capability."
Friedmann, T. A., et al. *Appl. Phys. Lett.*, vol. 68, No. 12. Mar. 1996.
Ferrari, A. C. et al. *Journal Appl. Phys.*, vol. 85, No. 10. May 1999.
Sze, S. M. "Physics of Semiconductor Devices." Wiley Publishing. 1981.

* cited by examiner

*Primary Examiner*—Minh-Loan T Tran
*Assistant Examiner*—Selim Ahmed
(74) *Attorney, Agent, or Firm*—Maginot, Moore & Beck

(57) ABSTRACT

A vertical semiconductor device includes a vertical, active region including a first semiconductor layer of a first conductivity type, a second semiconductor layer of a second conductivity type, and a third semiconductor layer of the first conductivity type, a trench extending through the third semiconductor layer at least into the second semiconductor layer, the trench comprising a first portion bordering on the third semiconductor layer, and the trench comprising a second portion extending at least into the second semiconductor layer starting from the first portion, an insulating layer associated with a control terminal and at least partially arranged on a side wall of the first portion of the trench and at least partially extending into the second portion of the trench, and a resistive layer with a field-strength-dependent resistance and arranged in the second portion of the trench at least partially on the sidewall and the bottom of the trench.

17 Claims, 7 Drawing Sheets

VERTICAL SEMICONDUCTOR DEVICE

This application claims priority from German Patent Application No. 102005052733.7, which was filed on Nov. 04, 2005, and is incorporated herein by reference in its entirety.

1. Field of the Invention

The present invention relates to a vertical semiconductor device with a control electrode arrangement robust against avalanche breakdowns and arranged in a trench, particularly to a vertical IGBT (Insulated Gate Bipolar Transistor) and a vertical IGFET (Insulated Gate Field Effect Transistor) or a vertical field plate trench transistor.

2. Description of the Related Art

In modern MOS-controlled power devices (MOS=Metal Oxide Semiconductor), cell concepts with vertical gate construction in trenches are employed for the enhancement of the pass resistance $R_{DS(on)}$. Thereby, higher packing density of the individual MOS transistor cells can be achieved. Furthermore, in the trenches, so-called trench field plates can be accommodated, which otherwise cause an increase in the blocking voltage by the build-up of compensation charges at the lateral MOS capacitances by the lateral field decay with otherwise equal dimensioning and design of the devices, i.e. identical doping and thickness of the drift zone. The use and concept of a field plate trench transistor was first described in U.S. Pat. No. 4,941,026 A and has continuously been developed further ever since.

FIG. 9 shows an n-channel field plate trench transistor 100 according to the prior art. The transistor 100 comprises an n⁺ substrate 110. An epitaxially deposited semiconductor layer 120 is arranged on the substrate 110. The transistor 100 shown in FIG. 8 further comprises two trenches 127a and 127b, on the side walls of which and on the bottoms of which a gate oxide layer (GOX) or field oxide layer 130a and 130b is applied. Here, the gate oxide layers have a smaller thickness in a first portion 130a and 130b of the side walls of the trenches 127a and 127b and in a second portion 133a and 133b including the lower regions of the sidewalls of the trenches and the bottoms of the trenches 127a and 127b. In the lower portions 133a and 133b of the trenches 127a and 127b, the gate oxide is also referred to as field oxide. The gate oxide layers 130a and 130b are part of the gate structure of the transistor 100, which includes both two gate electrodes (gate-poly) 140a and 140b and two gate terminals 150a and 150b. On the backside of the substrate 110, a metal layer 160 representing a drain terminal of the transistor 100 is applied. The transistor further includes a source region 172, a body region 173, a body contact region 174, a body enhancement 176, and a p⁺ semiconductor region 177.

FIG. 9 shows an elementary cell for a trench plate transistor according to the prior art. The optimization of the device has to take place particularly with respect to the robustness against avalanche loads. Here, the critical parts are the regions 183 below the p body 173 and the regions 184a and 184b around the bottoms of the trenches 127a and 127b. In the first case remedy is provided via a so-called body enhancement 176, which is described in U.S. Pat. No. 6,720,616 B2, and in the second case via a thick field oxide 130a and 130b in the lower portion 133a and 133b of the trenches, which is also shown in FIG. 9. A method of producing the oxide step in the trench is described DE 19 935 442 C1.

Omitting or neglecting the second measure poses a long-term reliability risk for the gate oxide 130a, 130b. Here, both under static blocking load and during the dynamic switch-off procedure, with too scarce dimensioning, degradation of the gate oxide 130a, 130b by a field super-elevation, as well as injection of hot electrons from the gate semiconductor region, which typically comprises silicon, may occur during the dynamic avalanche load.

A cell structure having trenches, i.e. a trench cell structure, currently also finds application in MOS-controlled bipolar transistors (IGBTs). Since IGBTs are employed in the high-voltage region for blocking voltages of 600 volts to 6500 volts, the trench projects into the drift zone only by a small fraction, as opposed to low-voltage power transistors.

FIG. 10 shows an IGBT structure 200 according to the prior art. The IGBT 200 comprises a p⁺ emitter 210. On the p⁺ emitter 210, a field stop region 215 is deposited, on which in turn an n-doped base layer 220 is deposited. A p-doped region 225, in which a highly doped p⁺ source region 245 is arranged, is formed in the base layer 220. The source region 245 is connected to a metal layer 255 forming a source terminal of the IGBT 200. In the base layer 220, a plurality of trenches 227 arranged adjacent to the region 225 are formed. A gate oxide 230 is formed on the trench walls and trench bottoms. The trenches 227 are filled with conducting material 240 (gate-poly).

For the electrical insulation of the gate-poly 240 from the metal layer 255, an intermediate oxide layer 265 is formed between the metal layer 255 and gate-poly 240. Furthermore, a floating p region 270, which is adjacent to the p region 225 and spaced therefrom by the trench 227, is formed in the base layer 220. The floating region 270 here extends into the base layer 220 and below the trenches 227. On the bottom side, the IGBT 200 comprises a metal layer forming an emitter terminal 260 of the IGBT 200.

As already mentioned above, since IGBTs are employed in the high-volt region or in the high-voltage region for blocking voltages of typically 600 volts to 6500 volts, the trenches 227 project into the drift zone 220 of the IGBT 200 by only a small fraction, as opposed to low-voltage power transistors. Thereby, the drift zone 220 spatially is very far apart from a drain region formed by the p⁺ emitter 210, and hence from the potential of the drain region. In this case, a potential present between the source terminal 255 and the drain terminal formed by the emitter terminal 260 largely decays via the drift path in the blocking case. In this case, the compensation principle also does not have any effect. By the great distance of the bottom of the trench 227 from the backside of the IGBT 200, a thicker field oxide as compared with the gate oxide or the thick insulation oxide is not required for the accommodation of a gate-drain voltage. For ensuring the robustness in the case of an avalanche discharge or the avalanche robustness in the blocking state during the dynamic switch-off procedure, the floating p region 270, which shields the electric field from the bottom of the trenches 227, is, however, usually diffused between the active cells around the bottom of the trenches 227.

In contrast to MOSFETs (metal oxide semiconductor field effect transistors), in the IGBT 200 the charge carriers are amplified by the p emitter 210, which forms a bipolar transistor with a current amplification factor $\alpha_{pnp}$ together with the p-doped region 225 and the drift zone (base layer) 220. As long as the edge region of the trenches 227 represents the limiting element in the occurrence of the avalanche breakdown (avalanche generation) in the blocking case, which usually is always the case with devices corresponding to the prior art, the IGBT has to be protected from over-voltage in the circuit in which it is being used. However, if the avalanche generation in the load case happens in the bulk of the device, i.e. not in the edge region of the trenches 227, the IGBT 200 may provide, by the internal amplification $\alpha_{pnp}$, so much current that over-voltage is suppressed and the device protects itself. Such over-voltages, for example, occur when switching off currents through the IGBT 200, which represents a multiple of a nominal current load of the IGBT 200. In the literature, this mechanism is referred to as so-called "self-clamping" phenomenon or also as "active clamping" phenomenon, as it is described by M. Takai et. al. in Proceedings ISPST 1999, Poster Session 7.1, for example.

From the user side, this self-protection is beneficial, since it makes external protective circuitry superfluous on the one hand, and operates reliably on the other hand, whereby a possibility for significant cost savings results. An effective measure to displace the "predetermined breaking point" for the avalanche generation at over-voltages from the edge region of the trenches 227 into the bulk of the device 200 is given by the decay of the out-diffusion of the p float region 270. Although the site of the avalanche generation is displaced into the active cell region with this, this poses the long-term reliability risks already stated above, which are accompanied by the degradation of the gate oxide 230, which may significantly affect the life and operational safety of devices.

SUMMARY OF THE INVENTION

In accordance with a first aspect, embodiments of the present invention provides a vertical semiconductor device, having: a vertical, active region including a first semiconductor layer of a first conductivity type, a second semiconductor layer of a second conductivity type, and a third semiconductor layer of the first conductivity type; a trench extending through the third semiconductor layer at least into the second semiconductor layer, the trench having a first portion bordering on the third semiconductor layer, and the trench having a second portion extending at least into the second semiconductor layer starting from the first portion; an insulating layer associated with a control terminal and at least partially arranged on a side wall of the first portion of the trench and at least partially extending into the second portion of the trench; and a resistive layer with a field-strength-dependent resistance and arranged in the second portion of the trench at least partially on the sidewall and the bottom of the trench.

In accordance with another aspect, an IGBT includes a vertical active region, a trench, a gate oxide, and a resistive layer. The vertical active region includes an emitter region of a first conductivity type, a base region of a second conductivity type, and a first region of the first conductivity type. The trench extends through the first region into the base region, and has a first portion adjacent to the first region and a second portion extending from the first portion at least into the base region. The gate oxide is associated with a gate terminal and is arranged on at least a portion of the trench. The resistive layer has a field-strength-dependent resistance and is arranged in at least a part of the second portion of the trench.

The above-described features, as well as others, will become more readily apparent to those of ordinary skill in the art by reference to the following detailed description and accompanying drawings.

BRIEF DESCRIPTION OF THE DRAWINGS

These and other objects and features of the present invention will become clear from the following description taken in conjunction with the accompanying drawings, in which.

DETAILED DESCRIPTION

Figure 1:
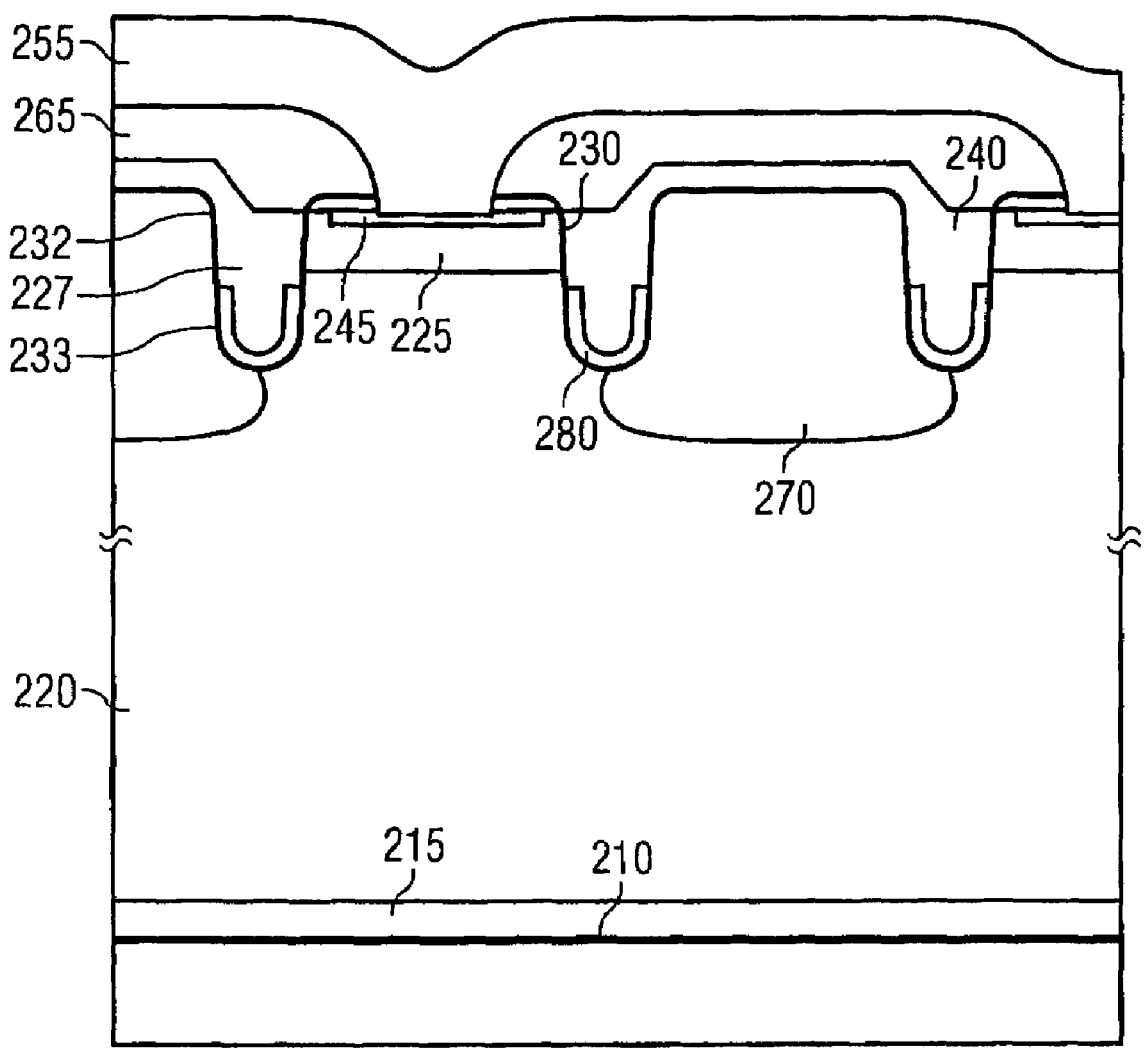
FIG. 1 is a schematic illustration of an inventive trench IGBT according to a first embodiment.

At least some embodiments of the present invention are advantageous based on the finding that by introducing a resistive layer with a field strength dependent resistance in a trench gate arrangement, effective over-voltage protection can be realized, wherein the dependence is to be designed so that the resistance decreases with increasing voltage or field strength, like in a varistor (variable resistor). Hereby, the oxide layer in the region of the bottom of the trenches of the trench gate arrangement is relieved or the strain is taken off the same following the example of a field plate trench, which leads to an improvement in the operational safety of a "self-clamping" IGBT. The relief is, however, not only achieved via the increase of the thickness of the dielectric, but by taking advantage of a recharge time constant by using a semi-insulating material with finite resistivity. Hereby, the relief of the gate oxide in the immediate surrounding of the site of the avalanche generation can be achieved.

For the resistive layer, varistor materials with ceramic character, such as ZnO or SiC, or semi-insulating layers of amorphous carbon or silicon or also an amorphous mixed phase, such as $Si_{1-x}C_x$, with x representing a number ranging from 0 to 1, are suitable. Further amorphous or polycrystalline substances or compounds are possible if they exhibit the required non-linearity in the resistance behavior.

Here, the specific conductivity is determined, among other things, via the morphology of the resistive layer and hence depends on the depositing conditions, together with the layer thickness of the resistive layer. Due to the geometric shape of the resistive layer, it also comprises a capacitance value apart from its electrical resistance, which determine the recharge time constant, i.e. an RC time. The resulting recharge time constant is adjusted via the features of the resistive layer so that the recharge time constant is comparable with or greater than the overload period at the device. This leads to the effective relief of the trench construction already mentioned in the critical region during the avalanche phase, which is why the relief according to the invention is also referred to RC relief in short.

A first embodiment of the present invention represents an IGBT, wherein the first semiconductor layer includes an emitter region, the second semiconductor layer a base region, and the third semiconductor layer a source region. The control terminal includes a gate electrode, and the insulating layer a gate oxide. The trench here extends as far as into the second semiconductor layer.

A second embodiment of the present invention represents an IGFET, wherein the first semiconductor layer includes a drain region, the second semiconductor layer a channel region, and the third semiconductor layer a source region. The control terminal includes a gate electrode, and the insulating layer a gate oxide.

With reference to FIGS. 1 to 8, a first embodiment of a vertical semiconductor device will be described. In FIGS. 1 to 8, the same reference numerals will be used for objects included in FIGS. 9 and 10 in identical form.

FIG. 1 shows a first embodiment of the vertical semiconductor device in form of a trench IGBT 200. As opposed to the IGBT shown in FIG. 10, the inventive trench IGBT 200 includes a resistive layer 280 with a finite electric conductivity in a lower portion 233 of the trench 227, while a first portion 232 of the trench walls is not covered. This resistive layer 280 reinforces the gate oxide in a critical region in analog manner, like in a field plate trench. In one embodiment, the floating p region 270 has a smaller spatial extension in the region below the bottoms of the trenches 227. The lateral out-diffusion of the p region around the trench bottom is reduced, in order to displace the avalanche generation in targeted manner to the pn junction between the floating p region 270 and the n-doped base region 220 at the occurrence of an over-voltage.

According to the invention, the operational safety in the "self-clamping" IGBT is enhanced by relieving the gate oxide 230 in the region of the bottom of the trenches by a enhancement according to the example of the field plate trench. But this is not only done via an increase of the dielectric thickness, but also by utilization of a recharge time constant by using a semi-insulating material with finite resistivity as resistive layer 280 in the trenches 227. Thereby, a relief of the gate oxide 230 in the immediate surrounding of the site of the avalanche generation develops.

The resistive layer 280 also comprises an electrical capacitance apart from an electrical resistance, so that it forms an RC element together with the gate oxide 230. In the case of an avalanche breakdown and an accompanying over-voltage, a relief of the gate oxide 230 results thereby, so that this potential step is partially transferred to the series connection of the capacitance of the resistive layer 280. By the finite conductivity of the resistive layer 280, this happens over a certain period with the recharge time constant as characteristic time constant. Furthermore, the resistive layer 280 forms a certain redundancy, which makes a path between the gate-poly 240 and the base layer 220 still remain capable of blocking by the voltage consumption in the capacitive series element also in the case of a local degradation of the gate oxide 230. Here, the resistance of the resistive layer 280 is designed so that a leakage current forming in the normal operation of the trench IGBT 200 in this case does not exceed a predetermined value or does not become too large.

Figure 2:
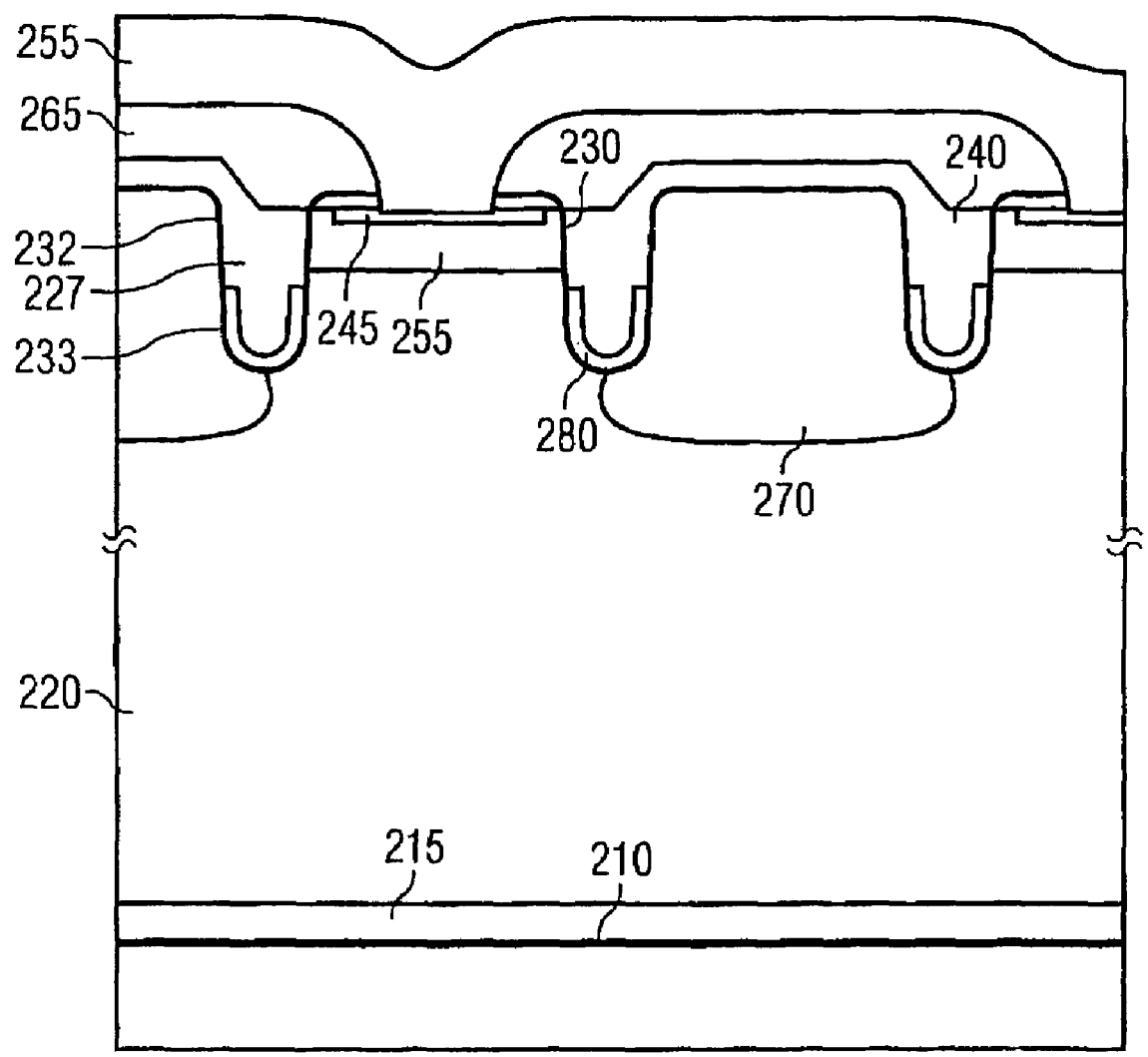
FIG. 2 is a schematic illustration of an inventive trench IGBT according to a second embodiment.

FIG. 2 shows a further embodiment of the present invention. FIG. 2 shows a schematic illustration of a cross-section of a standard construction of a trench IGBT 200 with an inventive RC relief with a back-etched gate oxide 230 below the resistive structure 280. In contrast to the trench IGBT 200 shown in FIG. 1, the gate oxide 230 in the device shown in FIG. 2 only partially covers the side walls of the trenches 227 (in the first portion), while the bottoms and the second portions 233 of the trenches 227 are not covered.

According to another embodiment, the resistive layer 280 extends across the floating p region 270 starting from the trenches 227.

Figure 9:
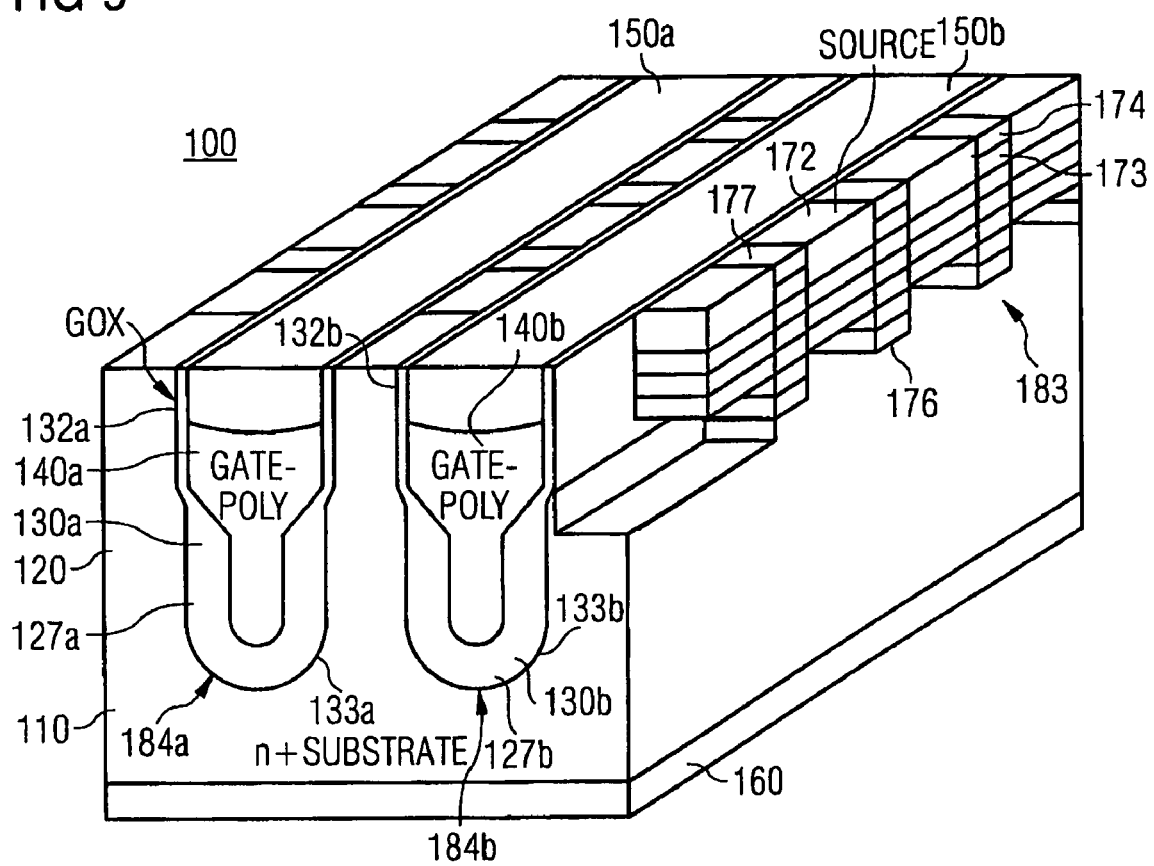
FIG. 9 shows an n-channel field plate transistor according to the prior art.
Figure 10:
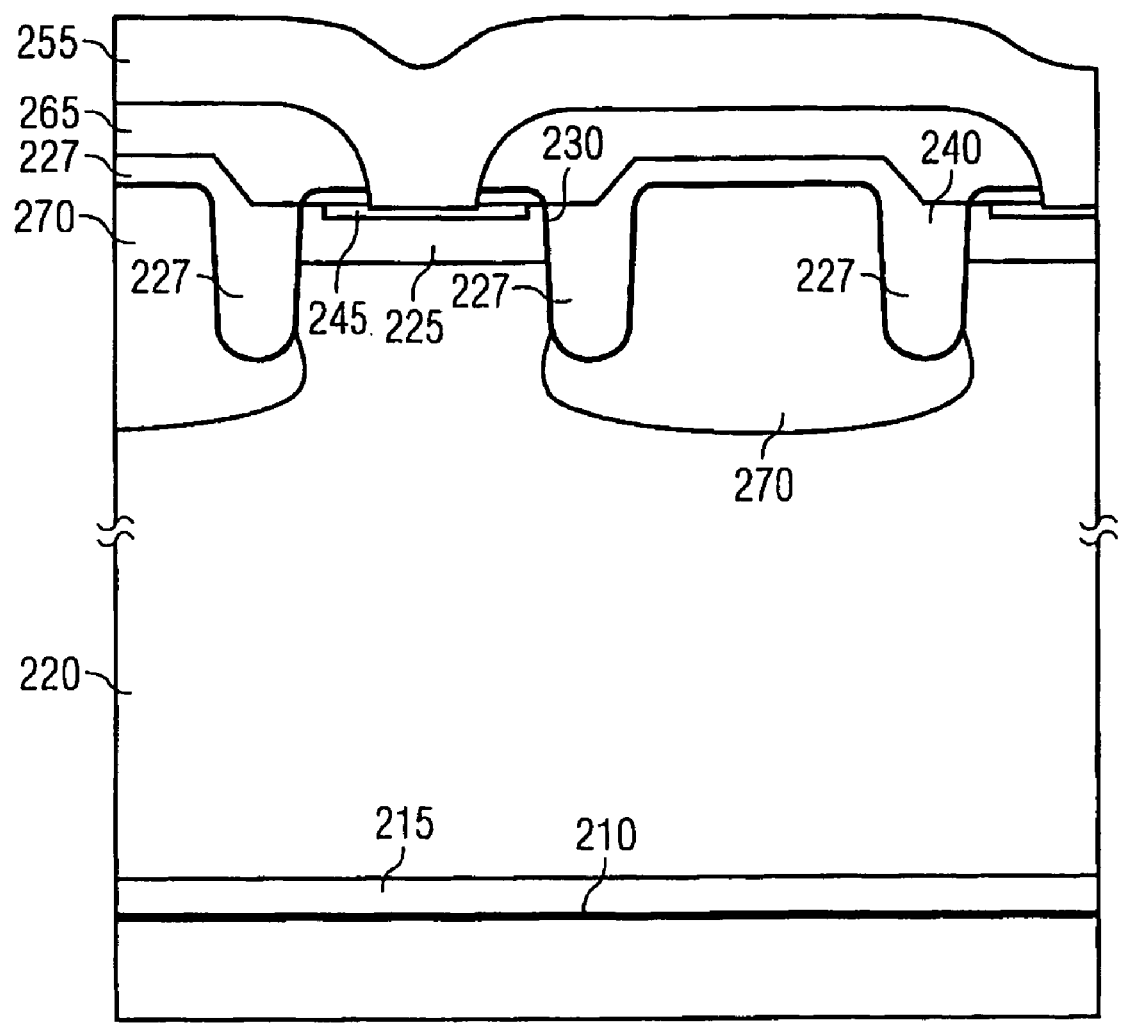
FIG. 10 shows a trench IGBT according to the prior art.

The above embodiments were explained on the basis of IGBT structures. But the present invention is not limited to such structures. While FIGS. 1 and 2 show embodiments of two IGBT structures for "active clamping", an analog implementation on a field plate trench transistor, as it is schematically illustrated in FIG. 9, may also be done. In this case, the thick field oxide in the lower portions of the sidewalls and the bottoms of the trenches may be replaced partially or completely by a resistive layer according to the invention.

Figure 3:
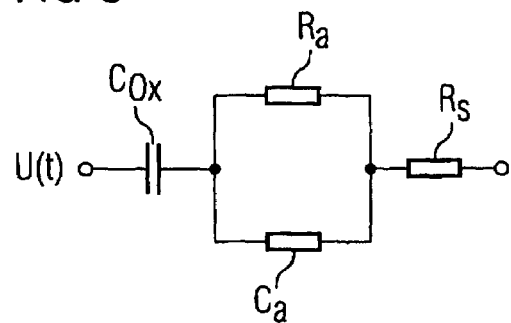
FIG. 3 is an equivalent circuit diagram for the gate-base path of the trench IGBT shown in FIG. 1.

In the following, the necessary boundary conditions for such an avalanche-robust trench gate arrangement, as it results by introducing a resistive layer into a trench gate arrangement, are deduced and explained. FIG. 3 shows an equivalent circuit diagram for the gate-base path 240, 220 of the inventive IGBT structure 200 according to FIG. 1. FIG. 3 shows a capacitance $C_{Ox}$ receiving a potential U(t) at a first terminal. The capacitance $C_{Ox}$ here represents the electrical capacitance of the gate oxide 230. A second terminal of the capacitance $C_{Ox}$ is attached to a parallel connection of a resistor $R_a$ and a capacitance $C_a$. The capacitance $C_a$ here represents the capacitive contribution of the resistive layer 280 of the trench IGBT 200, whereas the resistor $R_a$ represents the electrical resistance of the resistive layer 280. The parallel connection of the resistor $R_a$ and the capacitance $C_a$ is further connected to a further terminal via a further resistor $R_S$.

The arrangement of the resistive layer 280 and of the gate oxide 230 thus represents a capacitive voltage divider characterized by the capacitance $C_{Ox}$ of the gate oxide 230, the capacitance $C_a$ and the resistance $R_a$ or $R_S$ of the resistive layer 280. The resistors $R_a$ and $R_S$ take the finite conductivity of the resistive layer into account. The two resistance proportions may be determined from the frequency behavior within the scope of an impedance measurement. The resistor $R_a$ is also referred to as parallel resistance due to its connection, the resistor $R_S$ correspondingly also as series resistance. Likewise, due to its connection, the capacitance $C_a$ is also referred to as parallel capacitance. The determination of the resistance and capacitance proportions will be set forth further below for a concrete case. It can be seen that the series resistance $R_S$ mostly is much smaller than the dominant parallel resistance $R_a$. FIG. 3 also shows the equivalent circuit diagram for the gate-base path when "switching in" the resistive intermediate layer 230.

Technically speaking, the resistive layer 280 may for example be realized by conform deposition in the trench 227 and the selective back-etching by a resist plug in the lower region of the trench 227, as this corresponds to the prior art in the production of a field plate trench transistor according to DE 19 935 442 C1.

As material for the realization of the resistive layer 280, for example, amorphous or polycrystalline silicon may be employed. A further alternative is a semi-insulating layer of amorphous carbon or an amorphous or polycrystalline mixed phase, like $Si_{1-x}C_x$, with x ranging from 1 to 0. By the mixing ratio and the deposition condition, the specific conductivity σ may be adjusted over several decades. Amorphous or polycrystalline layers usually have a non-linear current-voltage behavior. With increasing voltage, i.e. with increasing electric field strength in the semiconductor material, the resistance decreases continuously. Such substances therefore find their field of application in so-called varistor devices among others. These non-linear resistors are mainly employed as overvoltage protection and for voltage regulation. The best-known representatives are the ZnO and the SiC varistor, in which a polycrystalline semiconductor forms the basic element, as this is also described in "Amorphe und polykrystalline Halbleiter" by W. Heywang (Springer-Verlag, 1984).

These materials may in principle also be used for the employment in the arrangements described here for the resistive layer 280.

After the conform deposition of the resistive layer 280 and the selective back-etching, the trenches 227 are filled with polysilicon 240 according to the common prior art, and the dopant added in the deposition is activated for the adjustment of the initial or characteristic voltage in a so-called dope-drive process. This often requires high temperatures in the range of typically 800° C. to 900° C., which particularly hydrogen-containing layers, which are deposited from hydrocarbons and/or hydrogen-containing silicon compounds in a PECVD (plasma enhanced chemical vapor deposition) method, can no longer cope with.

Here, an alternative are amorphous carbon layers produced by means of laser ablation (PLD=pulsed laser deposition) of pyrolytic graphite. In an article by T. A. Friedmann et al., appeared in Appl. Phys. Lett., Vol. 68, No. 12 of Mar. 18, 1996, and in an article by A. C. Ferrari et al., appeared in Journ. Appl. Phys., Vol. 85, No. 10 of May 15, 1999, hard, amorphous carbon layers with a high proportion of tetrahedral bonds, i.e. with a high proportion of $sp^3$-configured atoms, like in a diamond bond, are described, which were grown by a pulsed excimer laser within the scope of a PLD method. These layers are referred to as a-tC (amorphous tetrahedrally bonded carbon) in the literature and are characterized by a much higher temperature resistance as opposed to layers produced by means of PECVD methods, which are also referred to as PECVD layers in short, due to their low hydrogen content. While PECVD layers already transition to nanocrystalline graphite at typically 300° C. to 400° C. under hydrogen split-off, in the a-tC layers this process only sets in above typically 800° C. to 1000° C. in a vacuum. Hence, the a-tC layers present a material for the realization of the inventive trench gate arrangement, which is compatible with the manufacturing process of the gate contact according to the prior art.

A further alternative is the use of the so-called varistor materials ZnO (zinc oxide) or SiC (silicon carbide). But on the other hand, these require again high temperatures in the range of typically 1200° C. and 2000° C., respectively, for their production, which often is no longer consistent with the manufacturing process of an IGBT.

A simple method is to use the established technology of PECVD deposition and correspondingly reduce the temperature load in the production of the gate contact by the use of contact materials requiring a lower thermal budget.

In the following, the boundary conditions establishing the characteristic time constant or the recharge time constant will now be deduced and shown for the case of the use of amorphous layers. Here, the concrete embodiments are based on carbon layers having been produced by means of the PECVD method and having a high proportion of tetrahedral bonds ($sp^3$ bonds), which is why they are also referred to as DLC (diamond-like carbon) layers. These DLC layers, which are here also referred to as PECVD layers due to their production method, have a typical electric behavior, which may advantageously be used for the present application.

At a quick potential change at the first input of the capacitance $C_{Ox}$ of the circuit shown in FIG. 3, as it is typical for the quick switching procedure, and which is accompanied by a high field strength in the semiconductor substrate, the potential change toward the gate contact is no longer exclusively decreased via the gate oxide 230, but in part also transferred to the series element, i.e. the resistive layer 280. If an infinitely quick voltage increase at the time instant t=0 and then a constant voltage $U_0$ at the input of the voltage divider is assumed for simplicity reasons, wherein the second terminal of the series resistor $R_S$ lies at a potential 0 (for example a reference potential) as opposed to the constant voltage $U_0$, the following solution for a temporal voltage course $U_{Ox}$ at the gate oxide 230 results with a time constant or recharge time constant $\tau$:

$$U_{Ox}=U_0[1-\exp(-t/\tau)] \quad (1)$$

The time constant $\tau$ depends on the ratio of the ohmic to the capacitive resistance proportions of the voltage divider shown in FIG. 3. As long as the parallel resistance $R_a$ is large as opposed to the capacitive reactance $1/\omega C_a$, wherein $\omega$ is the angular frequency $\omega=2\pi \cdot f$ corresponding to a frequency f, the current flow through the voltage divider via the parallel capacitance $C_a$ is predominant. The voltage build-up at the gate oxide at a quick switching procedure thus is substantially determined by the RC time constant $\tau$, as it results from the series connection of the two capacitances $C_{Ox}$ and $C_a$ and the series resistor $R_S$.

$$\tau = R_S \cdot \frac{C_{Ox} C_a}{(C_{Ox} + C_a)} \quad (2a)$$

Conversely, considering the case that the parallel resistance $R_a$ is small as opposed to the capacitive reactance $1/\omega C_a$ ($R_a \ll 1/\omega C_a$), which corresponds to rather moderate switching speeds, the characteristic time constant $$\tau=(R_S+R_a) \cdot C_{Ox} \quad (2b)$$

results, with $(R_S+R_a)$ representing the resistance of the amorphous layer. Since this resistance, as assumed, decreases with increasing voltage and hence with increasing electric field strength, the time constant $\tau$ also becomes dependent on the field strength according to equation 2b. This leads to a reduction of the possibly very large time constant $\tau$, which would in particular arise with higher-ohmic layers. Particularly in the range of higher voltages, this leads to a reduction of the time constant $\tau$. In an intermediate frequency range, in which neither the boundary case of equation 2a nor that of equation 2b applies exclusively, the time constant is determined depending on the frequency and by all four proportions of the capacitances and resistances shown in FIG. 3, i.e. by all four proportions present in the circuit.

The voltage build-up in the gate oxide 230 is, in contrast to the case of a purely dielectric layer arrangement having no resistive layer 280, delayed by the influence of the resistances $R_a$ and $R_S$ in the case, i.e. both in quick and in slow switching procedures or also at a sudden voltage increase and also in the slower settling phase to a stationary final value. If the time constant $\tau$ here is adjusted so that it is greater than the time duration of the switching procedure, for example by a corresponding design of the layer thickness, the morphology, the geometry, and the electrical properties, only a fraction of the electric field strength becomes effective at the gate oxide 230.

In the following, as a special embodiment, a trench gate structure in which the gate oxide 230 and the resistive layer 280 comprise a layer sequence of $SiO_2$ and an amorphous diamond-like carbon layer (DLC layer) will be considered. The DLC layer may additionally be doped with silicon, if necessary, for the adjustment of the specific conductivity.

The electric behavior of such layers, particularly the electrical resistance, is determined by the morphology of the layers. In contrast to a monocrystalline structure, amorphous layers have a high density of state in the so-called mobility gap around the Fermi level. Although these states are easily rechargeable, only little current flow is enabled via so-called variable-range hopping processes at the Fermi level due to the low mobility of the charge carrier, as the above-mentioned book by W. Heywang shows. For this reason, such a material is also referred to as semi-insulating. At the occurrence of higher field strengths, however, the current grows over-proportionately with the applied voltage, and the field-induced emission of charge carriers according to the Poole-Frenkel conduction mechanism is dominant according to $$j(E_a) \propto E_a \cdot \exp\left(\frac{q\left(-\phi + \sqrt{\frac{qE_a}{\pi\varepsilon_a\varepsilon_0}}\right)}{kT}\right) \quad (3)$$

wherein j denotes the current density, $E_a$ the electric field in the amorphous layer, k the Boltzmann constant, T the absolute temperature, $\varepsilon_a$ the relative dielectric constant of the amorphous material, $\varepsilon_0$ the electric field constant, q the elementary charge, and $\phi$ the "potential well depth" of localized states or traps for the charge carriers, as the book by S. M. Sze entitled "Physics of Semiconductor Devices", published by Wiley, 1981, shows.

More thorough examinations demonstrate that the trap depth is correlated with the mobility gap or the optical band gap. The greater these are, the higher the trap depth. Summarizing the factors independent of the electric field strength, one obtains $$j(E_a) = \sigma_{PF} E_a \cdot \exp\left(\frac{q\sqrt{\frac{qE_a}{\pi\varepsilon_a\varepsilon_0}}}{kT}\right) \quad (4)$$

with $$\sigma_{PF} = \sigma_0 \cdot \exp\left(\frac{-q\phi}{kT}\right) \quad (4a)$$

The electric field strength across the amorphous layer is dependent on a thickness $d_a$ of the resistive layer 280

$$E_a = \frac{U_a}{d_a} \quad (5)$$

Substituting equation 5 in equation 4, the following finally results for the current-voltage characteristic curve of the semi-insulating layer at higher field strengths:

$$j(U_a) = \frac{\sigma_{PF}}{d_a} \cdot U_a \cdot \exp\left(\frac{q\sqrt{\frac{qU_a}{\pi\varepsilon_a\varepsilon_0 d_a}}}{kT}\right) \quad (6)$$

This connection may be used for the description of the experimentally obtained characteristic curves or the experimentally acquired current-voltage characteristic curves. In a plot of $\ln(j/U)$ versus $\sqrt{U}$, such a linear connection can be expected.

Figure 4:
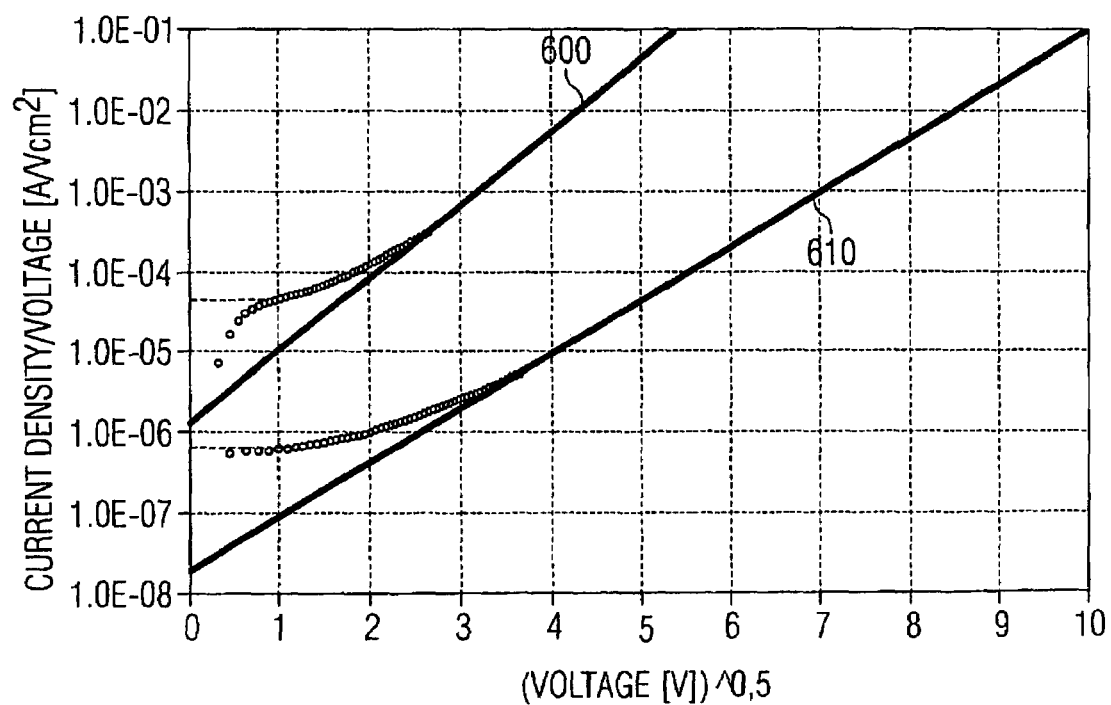
FIG. 4 is an illustration of two current-voltage characteristic curves of two DLC (diamond-like carbon) layers with two numerically calculated and adapted courses each.

FIG. 4 shows a plot of a first current-voltage characteristic curve 600 and a second current-voltage characteristic curve 610 in an illustration conforming to equation 6. The two current-voltage characteristic curves have been taken at two different DLC layers deposited by means of the PECVD method. The open dots of the two current-voltage characteristic curves 600 and 610 represent the experimentally acquired measurement data, wherein the upper curve 600 corresponds to a layer thickness of the DLC layer of about 330 nm and the lower curve 610 to a layer thickness of about 600 nm. The solid straight lines represent the connection according to the Poole-Frenkel law in accordance with equation 6. In the dashed lines, a voltage-independent hopping portion of the specific conductivity has additionally been taken into account in a fit, which is only dominant at low field strengths. At higher voltages, i.e. in case of the current-voltage characteristic curve 600 in the range between about $3\sqrt{V}$ to about $5\sqrt{V}$ and in case of the current-voltage characteristic curve 610 in the range between about $4\sqrt{V}$ to about $10\sqrt{V}$, the specific conductivity satisfies the law named after Poole and Frenkel for the field-induced emission of the charge carriers, i.e. equation 6.

If the layer thickness and the dielectric constant of a DLC layer are known, the constant $\sigma_{PF}$ can be determined from a straight line in accordance with equation 6, which may be determined by a least square fit and is also drawn in FIG. 4.

The two samples, the current-voltage characteristic curves 600 and 610 of which are illustrated in FIG. 4, were produced by deposition of the DLC layer on a silicon wafer without oxide intermediate layer in this case. The current flow vertically through the layer took place by ohmic point contacts on the DLC layer, with the series resistance in the silicon wafer having been neglected. So as to suppress blocking layer effects, the measurements were performed at a forward bias of the amorphous-crystalline junction. At very low voltages or electric field strengths, the conductivity approximates a constant value corresponding to the resistivity of the hopping line.

The relative dielectric constant of the DLC layer may be determined from the slope of the straight line or directly from a capacitance-voltage measurement.

Figure 5:
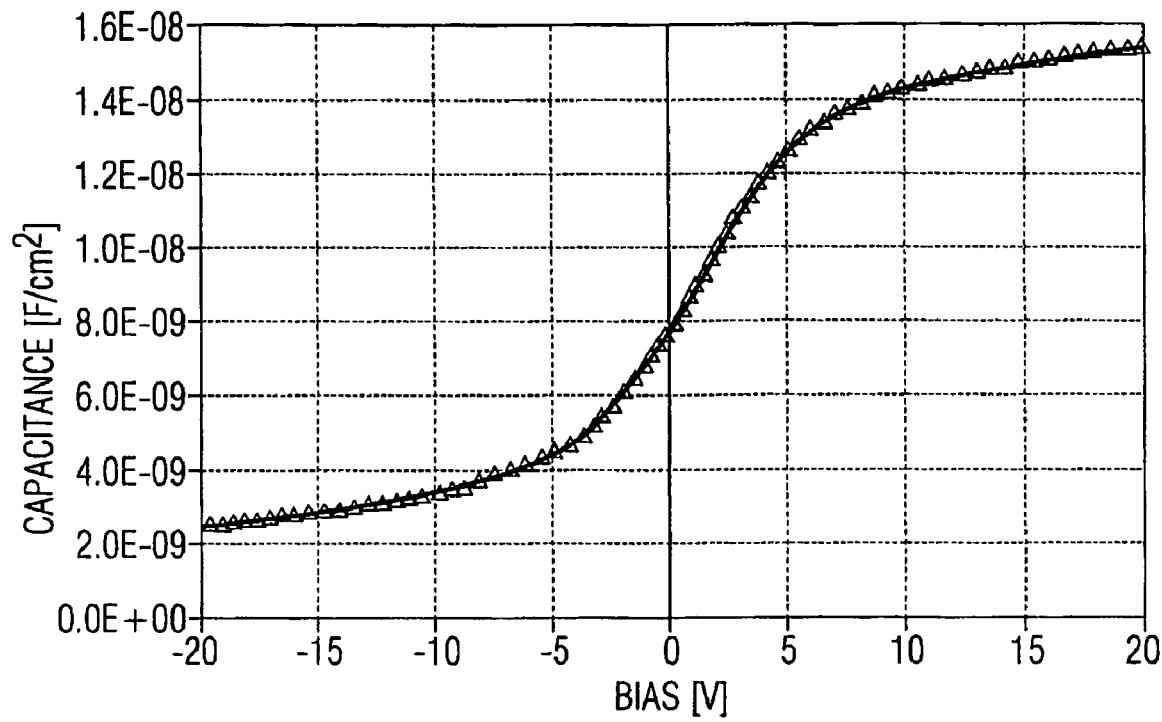
FIG. 5 is an illustration of a capacitance-voltage measurement of a DLC layer.

FIG. 5 shows an illustration of a result of a capacitance-voltage measurement of the sample with about 330 nm thickness, the current-voltage characteristic curve 600 of which is illustrated in FIG. 4. The measurement was performed at a frequency of 100 kHz. The saturation value at a positive transport voltage or a positive bias voltage corresponds to the dielectric capacitance of the DLC layer, from which the dielectric constant $\varepsilon_a$ results with the aid of the equation 9 indicated further below. In other words, the saturation value in accumulation at a positive bias voltage corresponds to the dielectric capacitance of the DLC layer, from which the value $\varepsilon_a$ can be calculated, with the aid of equation 9 indicated further below.

As already mentioned, the dielectric capacitance of the DLC layer results from the saturation value in "accumulation", just like the saturation value in "accumulation" corresponds to an oxide capacitance in case of an MOS capacitor.

A corresponding C(U) characteristic for the amorphous-crystalline junction, measured at a frequency of 100 kHz, is illustrated in FIG. 5. A dielectric constant of about $\varepsilon_a \approx 6$ results therefrom.

With the aid of this value and the layer thickness of the DLC layer of about 330 nm determined in optical way, for example, or of about 600 nm in the case of the second sample, the measured current-voltage characteristic curves and the ones calculated according to equation 6 can excellently be made to coincide. With additional consideration of the field-strength-independent hopping portion, the specific conductivity finally results:

$$\sigma(E_a) = \sigma_{Hop} + \sigma_{PF} \cdot \exp\left(\frac{q\sqrt{\frac{qE_a}{\pi\varepsilon_a\varepsilon_0}}}{kT}\right) \quad (7)$$

With a homogeneous layer with the thickness $d_a$ and a cross-sectional area A, the resistance thus results at:

$$R_a = \frac{d_a}{\sigma \cdot A} \quad (8)$$

Furthermore, the following applies for the oxide capacitance with a thickness $d_{Ox}$ of the gate oxide 230:

$$C_{Ox} = \frac{\varepsilon_{Ox}\varepsilon_0}{d_{Ox}} \cdot A \quad (9)$$

The field-strength-dependent time constant results from the equations 2b, 8, and 9 according to:

$$\tau = \frac{d_a \cdot \varepsilon_0 \cdot \varepsilon_{Ox}}{\sigma(E_a) \cdot d_{Ox}} \quad (10)$$

At sufficiently small electric field strengths, according to equation 7, this approximates the limit of:

$$\tau(E \to 0) = \tau_0 = \frac{d_a \cdot \varepsilon_0 \cdot \varepsilon_{Ox}}{(\sigma_{Hop} + \sigma_{PF}) \cdot d_{Ox}} \quad (11)$$

For the case that the field plate "dielectric" only comprises a semi-insulating material, i.e. for example only a DLC layer without underlying gate oxide, the capacitor $C_{Ox}$ or the series capacitor $C_{Ox}$ in FIG. 3 is omitted and the time constant disappears in the low-frequent boundary case, i.e. approximates 0. The voltage drop across the semi-insulating layer or the resistive layer 280 then is exclusively determined according to the Poole-Frenckel law, and a finite gate current will finally develop in the stationary state. The quick switching procedure at the beginning would, however, in this case be determined by the time constant of the amorphous material $$\tau = R_S \cdot C_a \quad (12)$$

Figure 6:
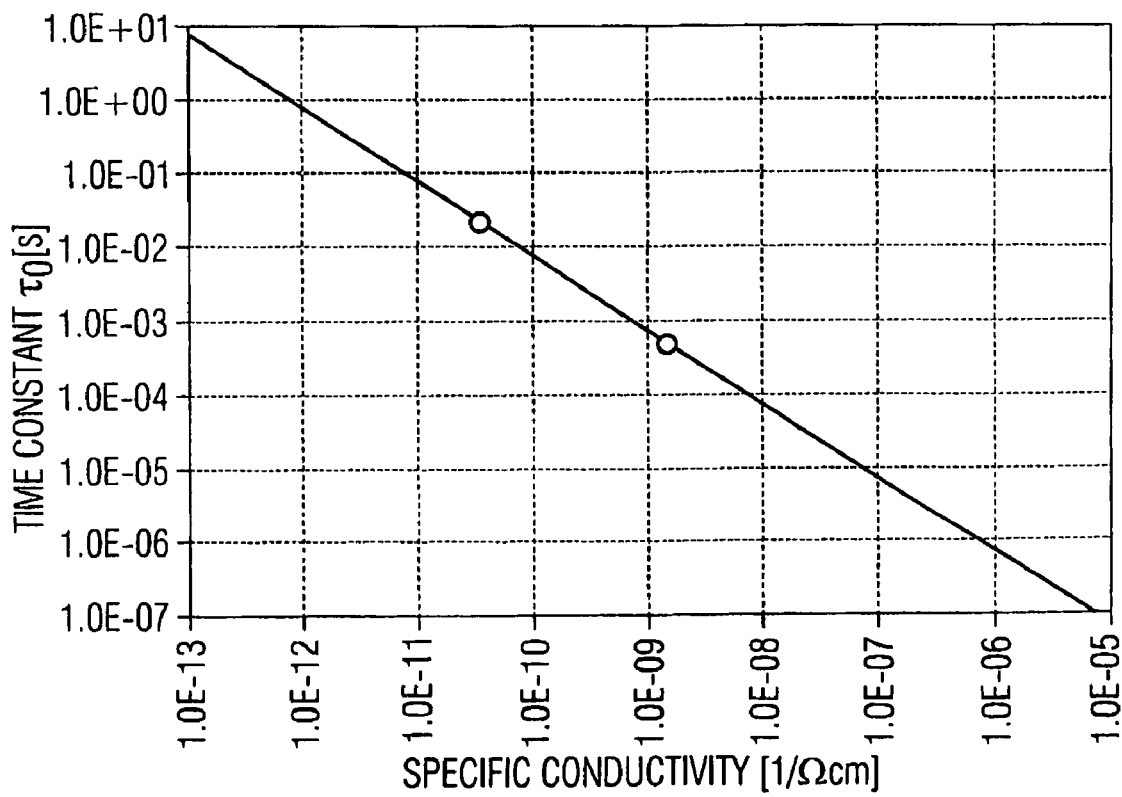
FIG. 6 is an illustration of the recharge time constant $\tau_0$ at low field strengths in dependence on the specific conductivity $\sigma$.

FIG. 6 shows an illustration of a recharge time constant $\tau_0$ at low field strength in accordance with equation 11 as a function of the specific conductivity. Moreover, FIG. 6 shows two points corresponding to the two samples, the current-voltage characteristic curves of which are shown in FIG. 4. The data shown in FIG. 6 is based on the following starting values: $d_{Ox}=100$ nm, $d_a=200$ nm and $\varepsilon_{Ox}=4$.

In FIG. 6, the dependencies for a special case are plotted exemplarily. In case of an oxide thickness of 100 nm and a thickness of the semi-insulating material of 200 nm, according to equation 11, at first a time constant or re-charge time constant $\tau_0$ results depending on the specific conductivity of the basic material, i.e. the specific conductivity of the resistive layer 280. But this value may be reduced over several orders of magnitude via a field-strength-dependent reduction factor $\tau/\tau_0$, when the electric field strength becomes correspondingly large, as FIG. 7 exemplarily shows.

Figure 7:
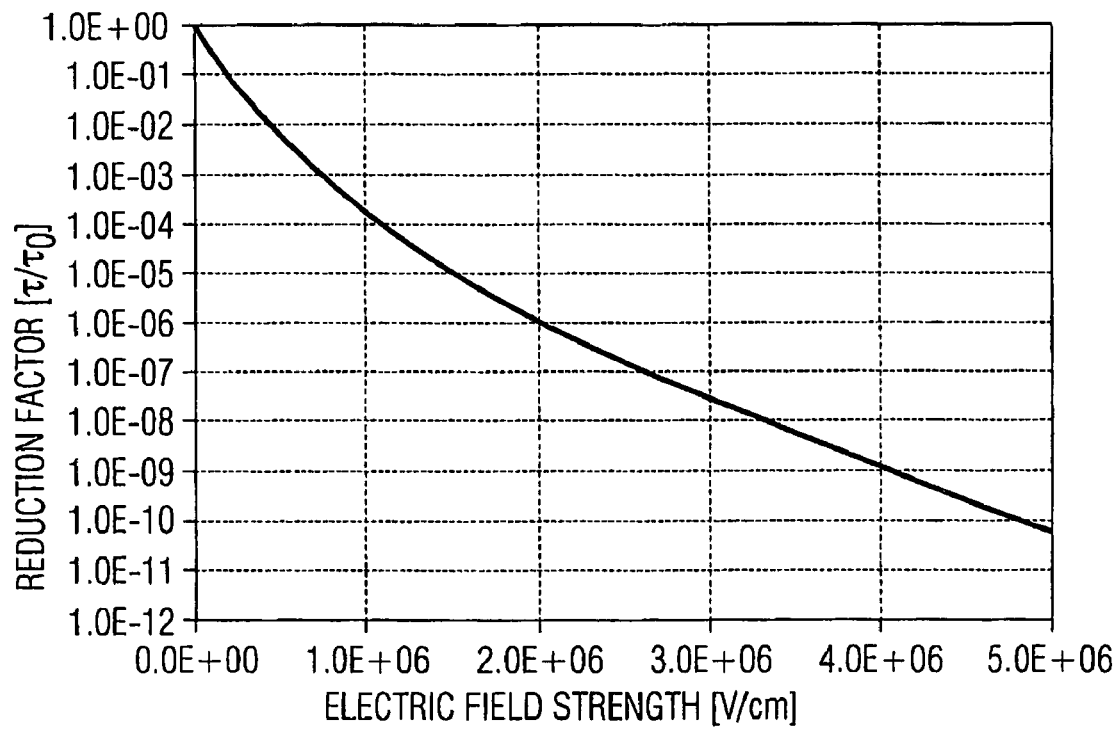
FIG. 7 is an illustration of a course of a field-strength-dependent reduction factor $\tau{:}\tau_0$ in dependence on the electric field strength.

FIG. 7 shows an illustration of an exemplary dependence of the reduction factor $\tau/\tau_0$ depending on the electric field strength for the recharge time constant or the time constants of the two samples, the current-voltage characteristic curves of which are included in FIG. 4. In the normal operation of an IGBT, typically field loads of typically about 2.5 MV/cm of the dynamic switch-off procedure occur at the gate oxide 230. The switching times typically are in a range of about 0.2 µs to about 2 µs, often in the range of about 0.5 µs to about 1 µs. At over-voltages, the value for the electric field may double and finally lead to the degradation of the gate oxide 230 at more frequent occurrence. The duration of the overload phase typically lies in the order of magnitude of about 100 ns.

So as to effectively relieve the gate oxide 230 in this case, the recharge time constant has to be designed so that it is greater than or equal to the duration of the overload phase. Since the DLC layer 280 has been designed twice as thick as the gate oxide 230, the electric field in the gate oxide 230 will be reduced to one third of the original value at the beginning of the switching operation in the worst case, i.e. in the case of an infinitesimal series resistance $R_S$ ($R_S \to 0$), and hence also for an infinitesimal time constant $\tau(\tau \to 0)$ in accordance with equation 2a. Although this reduction is mitigated by the slightly higher electric constant of the diamond-like carbon (DLC) with a value of $\varepsilon_a=6$ as opposed to a value $\varepsilon_{Ox}=4$, approximately a halving of the original peak field strength results as a whole due to the series capacitance.

So as to be able to relieve the gate oxide 230 in an even more effective manner, the switching procedure has to be shorter than the (finite) characteristic time constant $\tau$. Because in the further course the voltage level at the gate oxide 230 will rise to the stationary value $U_0$, also at a finite series resistance $R_S$. On the other hand, the initial voltage drop then exclusively takes place at the series resistor $R_S$ in accordance with equation 1. In the normal operation of the inventive IGBT, a full punch-through or effect of the voltage is, however, again desired, because thereby full conduction of the accumulation border layer at the trench side wall 232, 233 is guaranteed, which causes a low electrical resistance in the gated-through state of the device (on-state resistance) for the electrons flowing out of the source region 245. Thus, it is critical that the time constant $\tau$ is adapted to the short duration of the overload phase by a corresponding design of the oxide layer 230 and the resistive layer 280.

Even periodically occurring over-voltages do not pose any problem when using this integrated protective circuit, because the field-dependent decrease of the resistance counters possible charging effects. At an increase of the electric field, which would be accompanied by a charge, the amorphous material reacts with an active negative feedback by the ever-quicker discharge due to the (low-frequency) field-strength-dependent recharge time constant $\tau$.

Finally, in the following it will now be described how, by means of a frequency-dependent impedance measurement, the individual resistance and capacitance portions of the capacitive voltage divider illustrated in FIG. 3 can be accurately determined and used for targeted tuning of the characteristic time constant $\tau$. To this end, for example a test structure is used, which comprises a carrier wafer with an ohmic backside contacting and a layer system of a thermally grown oxide and a DLC layer, as it corresponds to the arrangement and layer sequence in the trench 227 of the inventive trench IGBT 200 illustrated in FIG. 1, i.e. in the trench gate. By means of vapor-deposited point contacts, then the characteristic of this MOS capacitance is measured for example with the aid of an LCR meter, such as the HP4284A.

The measurement of the capacitance C and the resistance R in form of the imaginary part and the real part of the complex impedance $Z=R+(i\omega C)^{-1}$ is done at a variable frequency f at a fixed voltage value. The angular frequency $\omega$ going into the expression for the complex impedance here satisfies the already known relation $\omega=2\pi \cdot f$ with respect to the frequency f. The fixed voltage value or bias value here is to be chosen so that the silicon interface is in strong accumulation, in order to avoid an additional series capacitance due to a depletion border layer. Under these boundary conditions, the equivalent circuit diagram shown in FIG. 3 applies. The impedance of this circuit results from:

$$Z = \frac{1}{i\omega C_{Ox}} + \frac{1}{i\omega C_a + \frac{1}{R_a}} + R_S \quad (13)$$

This leads to the following expressions for the overall resistance R and the overall capacitance C of the test structure:

$$R = R_S + \frac{R_a}{\omega^2 R_a^2 C_a^2 + 1} \quad (14)$$

$$C = \frac{C_{Ox}(1 + \omega^2 R_a^2 C_a^2)}{\omega^2 R_a^2 C_a(C_{Ox} + C_a) + 1} \quad (15)$$

The asymptotic behavior of the overall resistance R and the overall capacitance C for high frequencies ($\omega \to \infty$) and low frequencies ($\omega \to 0$) finally leads to the following limits:

$$R(\omega \to \infty) = R_S \quad (16a)$$

$$C(\omega \to \infty) = \frac{C_{Ox} \cdot C_a}{(C_{Ox} + C_a)} \quad (16b)$$

and $$R(\omega \to \infty) = R_S + R_a \quad (17a)$$

$$C(\omega \to 0) = C_{Ox} \quad (17b)$$

By comparison of the limits of the overall capacitance C and the overall resistance R measured at sufficiently high and sufficiently low frequencies f, the individual elements or contributions of the components shown in FIG. 3 of the equivalent circuit diagram can be determined. An example for such a measurement can be found in FIG. 8.

Figure 8:
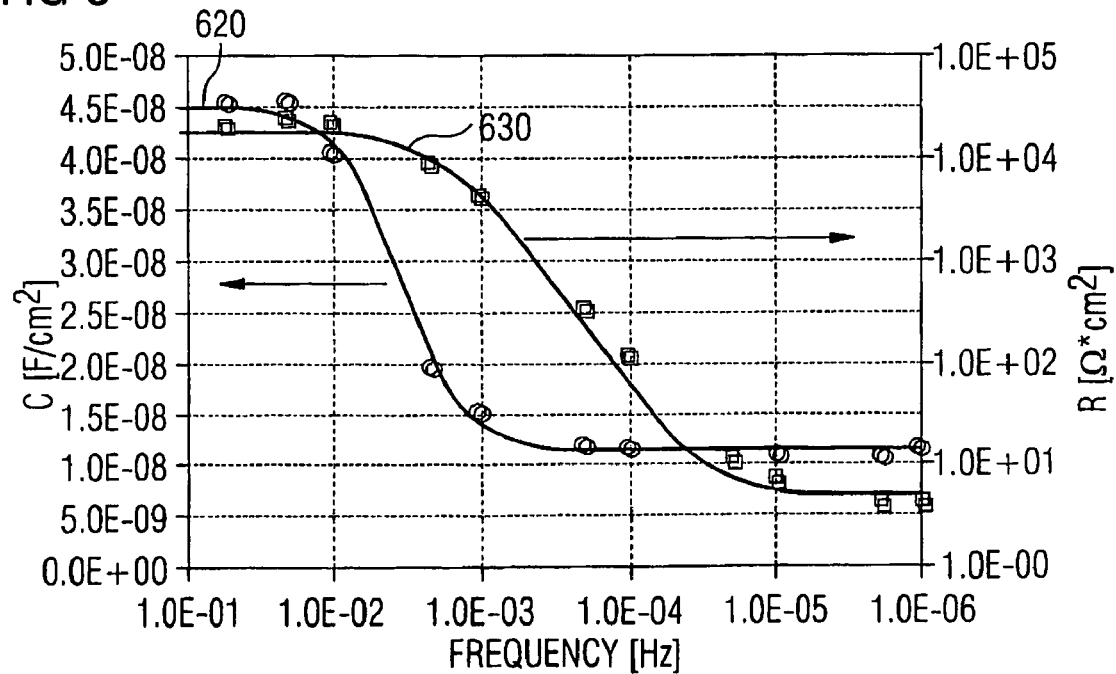
FIG. 8 is an illustration of a course of a resistance and of a course of a capacitance of a capacitive voltage divider according to the equivalent circuit diagram from FIG. 3.

FIG. 8 shows an illustration of the overall resistance R and the overall capacitance C of a capacitive voltage divider, as it is illustrated in FIG. 3, depending on the frequency f in a frequency range between 20 Hz and 1 MHz, as they are obtained in a frequency-dependent impedance measurement, for example. Here, FIG. 8 shows, with reference to the resistance of a capacitive voltage divider, a resistance course 620 as a solid line and measurement data, which were measured on a test wafer with a gate oxide and a DLC layer, in detail. With reference to the capacitance, FIG. 8 also shows a capacitance course 630 as a solid line as well as measurement data, which were measured at the test wafer with a gate oxide and a DLC layer. The circles and squares here show the measurement data, whereas the solid lines were calculated with the aid of the equations 14 and 15.

Both the resistance course 620 and the capacitance course 630 have a similar course here. In the range of low frequencies, i.e. in the range below 20 Hz, both courses exhibit an almost constant course. In the range of higher frequencies, i.e. in the range above 900 kHz, both courses also have an almost frequency-independent value. The measurements also show a saturation behavior both in the range of higher frequencies and in the range of low frequencies, with both the resistance course 620 and the capacitance course 630 having higher values in the range of low frequencies than in the range of high frequencies. In the intermediate range, i.e. in the range between about 20 Hz and about 900 kHz, both courses comprise a steady transition between the saturation values and the asymptotic values at low and high frequencies. By comparison of the asymptotic values of the courses shown in FIG. 8 and the equations 16a, 16b, 17a and 17b, approximately the following values for the individual components of the equivalent circuit diagram of the capacitive voltage divider shown in FIG. 3 result for the concrete case:

$R_a = 1.8 \cdot 10^4 \Omega \text{cm}^2$, $R_S = 5 \Omega \text{cm}^2$, $C_{Ox} = 4.5 \cdot 10^{-8} F/\text{cm}^2$ and $C_a = 1.5 \cdot 10^{-8} F/\text{cm}^2$.

The characteristic time constant $\tau$ for the high-frequency case, i.e. the boundary case $\omega \to \infty$, resulting from the multiplication of equation 16a and 16b, provides the time delay at the voltage build-up at the gate oxide by the finite series resistance $R_S$. In the concrete example, about 56 ns are obtained here. A reduction of the DLC layer thickness to a value comparable with the gate oxide would lead to a doubling of the time constant. It would thus be on the order of magnitude of the duration of a typical overload case, which typically lies at about 100 ns, as already mentioned above. Under these boundary conditions, a relief of the gate oxide 230 can thus be guaranteed by introducing a resistive layer 280 according to the invention.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A vertical semiconductor device, comprising:
   a vertical, active region including a first semiconductor layer of a first conductivity type, a second semiconductor layer of a second conductivity type, and a third semiconductor layer of the first conductivity type;
   a trench extending through the third semiconductor layer at least into the second semiconductor layer, the trench comprising a first portion bordering on the third semiconductor layer, and the trench comprising a second portion extending at least into the second semiconductor layer starting from the first portion;
   an insulating layer associated with a control terminal and at least partially arranged on a side wall of the first portion of the trench and at least partially extending into the second portion of the trench; and
   a resistive layer with a field-strength-dependent resistance and arranged in the second portion of the trench at least partially on the sidewall and the bottom of the trench.

2. The vertical semiconductor device of claim 1, wherein the insulating layer extends across the side wall of the second portion of the trench to the bottom of the trench, and wherein the resistive layer is arranged above the insulating layer.

3. The vertical semiconductor device of claim 1, wherein the insulating layer only partially extends onto the side wall of the second portion of the trench, and wherein the resistive layer is arranged on the side wall and on the bottom of the trench.

4. The vertical semiconductor device of claim 1, wherein the resistance of the resistive layer decreases with increasing electric field strength across the resistive layer.

5. The vertical semiconductor device of claim 1, wherein the resistive layer is formed such that a recharge time constant is comparable with or greater than the duration of an overload period.

6. The vertical semiconductor device of claim 5, wherein the recharge time constant depends on the resistance of the resistive layer and a capacitance value associated with the resistive layer.

7. The vertical semiconductor device of claim 6, wherein the resistance and the capacitance value depend on a resistivity, a layer thickness and a morphology of the resistive layer.

8. The vertical semiconductor device of claim 1, wherein the resistive layer is made from a material selected from a group including ceramic materials and semi-insulating materials.

9. The vertical semiconductor device of claim 8, wherein the ceramic material is selected from a group including polycrystalline ZnO or SiC, and wherein the semi-insulating material is selected from a group including amorphous carbon, amorphous silicon or an amorphous mixed phase thereof.

10. The vertical semiconductor device of claim 1, wherein the semiconductor device includes an IGBT structure, wherein the first semiconductor layer includes an emitter region, the second semiconductor layer includes a base region, and the third semiconductor layer includes a source region,
wherein the control terminal includes a gate electrode, wherein the insulating layer includes a gate oxide, and wherein the trench extends into the second semiconductor layer.

11. The vertical semiconductor device of claim 10, further comprising a floating semiconductor region of the first conductivity type, which is arranged adjacent to the third semiconductor layer and spaced apart therefrom by the trench, wherein the floating semiconductor region extends into the second semiconductor layer and further partially below the trench.

12. The vertical semiconductor device of claim 11, further comprising a further trench, which is arranged adjacent to the floating semiconductor region, wherein the resistive layer extends into the further trench starting from the trench adjacent to the third semiconductor region across the floating semiconductor region.

13. An IGBT comprising:
a vertical active region including an emitter region of a first conductivity type, a base region of a second conductivity type, and a first region of the first conductivity type,
a trench extending through the first region at least into the base region, the trench having a first portion adjacent to the first region and a second portion extending from the first portion at least into the base region;
a gate oxide associated with a gate terminal, the gate oxide arranged on at least a portion of the trench; and
a resistive layer with a field-strength-dependent resistance and arranged in at least a part of the second portion of the trench.

14. The IGBT of claim 13, further comprising a floating semiconductor region of the first conductivity type arranged adjacent to the source region and spaced apart therefrom by the trench, the floating semiconductor region extending into the base region and partially below the trench.

15. The IGBT of claim 14, further comprising a further trench arranged adjacent to the floating semiconductor region; and
wherein the resistive layer extends into the further trench starting from the trench adjacent to the source region across the floating semiconductor region.

16. The IGBT of claim 13, wherein the resistance of the resistive layer decreases with increasing electric field strength across the resistive layer.

17. The IGBT of claim 13, wherein the resistive layer is formed such that a recharge time constant is comparable with or greater than the duration of an overload period.

* * * * *